United States Patent
Kapusta et al.

(10) Patent No.: US 11,635,496 B2
(45) Date of Patent: Apr. 25, 2023

(54) DATA REDUCTION FOR OPTICAL DETECTION

(71) Applicant: Analog Devices International Unlimited Company, Limerick (IE)

(72) Inventors: Ronald A. Kapusta, Carlisle, MA (US); Brian D. Hamilton, Menlo Park, CA (US)

(73) Assignee: Analog Devices International Unlimited Company, Limerick (IE)

( * ) Notice: Subject to any disclaimer, the term of this patent is extended or adjusted under 35 U.S.C. 154(b) by 769 days.

(21) Appl. No.: 16/566,043

(22) Filed: Sep. 10, 2019

(65) Prior Publication Data

US 2021/0072358 A1 Mar. 11, 2021

(51) Int. Cl.
| | |
|---|---|
| *G01S 7/4861* | (2020.01) |
| *G01S 7/481* | (2006.01) |
| *G01S 7/487* | (2006.01) |
| *G01S 17/10* | (2020.01) |
| *H03M 1/06* | (2006.01) |

(52) U.S. Cl.
CPC ............ *G01S 7/4861* (2013.01); *G01S 7/487* (2013.01); *G01S 7/4811* (2013.01); *G01S 17/10* (2013.01); *H03M 1/0609* (2013.01)

(58) Field of Classification Search
None
See application file for complete search history.

(56) References Cited

U.S. PATENT DOCUMENTS

| | | |
|---|---|---|
| 6,526,394 B2 | 2/2003 | Baker et al. |
| 6,819,407 B2 | 11/2004 | Arita et al. |
| 7,760,131 B2 | 7/2010 | Tyree et al. |
| 8,242,476 B2 | 8/2012 | Mimeault et al. |
| 8,310,655 B2 | 11/2012 | Mimeault |

(Continued)

FOREIGN PATENT DOCUMENTS

| | | |
|---|---|---|
| CN | 105759279 | 7/2016 |
| CN | 112558079 | 3/2021 |

(Continued)

OTHER PUBLICATIONS

"U.S. Appl. No. 16/051,096, Non Final Office Action dated Jan. 27, 2021", 36 pgs.

(Continued)

*Primary Examiner* — Eric L Bolda
(74) *Attorney, Agent, or Firm* — Schwegman Lundberg & Woessner, P.A.

(57) ABSTRACT

In an optical detection system, features of interest can be identified from ADC circuitry data prior to inter-circuit communication with downstream object or target processing circuitry. In this manner, a volume of data being transferred to such downstream processing circuitry can be reduced as compared to other approaches, simplifying the receive signal processing chain and providing power savings. First-tier signal processing circuitry to identify features of interest can be located on or within a commonly-shared integrated circuit package with ADC circuitry, and downstream processing circuitry for object processing or range estimation can be fed with a data link meeting less stringent requirements than a link between the ADC circuitry and first-tier signal processing circuitry.

20 Claims, 5 Drawing Sheets

(56) References Cited

U.S. PATENT DOCUMENTS

| | | |
|---|---|---|
| 8,319,949 B2 | 11/2012 | Cantin et al. |
| 8,492,710 B2 | 7/2013 | Fuhrer et al. |
| 8,619,241 B2 | 12/2013 | Mimeault |
| 8,767,215 B2 | 7/2014 | Cantin et al. |
| 8,836,944 B2 | 9/2014 | Nikiforov et al. |
| 9,347,773 B2 | 5/2016 | Stutz et al. |
| 9,575,184 B2 | 2/2017 | Gilliland et al. |
| 9,684,066 B2 | 6/2017 | Bartolome et al. |
| 10,007,001 B1 | 6/2018 | Lachapelle et al. |
| 10,466,342 B1 | 11/2019 | Zhu et al. |
| 10,473,785 B2 | 11/2019 | Kubota et al. |
| 10,520,602 B2 | 12/2019 | Villeneuve et al. |
| 10,613,225 B2 | 4/2020 | Kubota et al. |
| 10,620,302 B2 | 4/2020 | Zhu et al. |
| 10,739,456 B2 | 8/2020 | Kubota et al. |
| 11,016,183 B2 | 5/2021 | Gill et al. |
| 11,022,680 B2 | 6/2021 | Hinderling et al. |
| 2002/0084414 A1 | 7/2002 | Baker et al. |
| 2003/0053550 A1 | 3/2003 | Peyla et al. |
| 2008/0309914 A1 | 12/2008 | Cantin et al. |
| 2009/0027257 A1 | 1/2009 | Arikan et al. |
| 2010/0066597 A1 | 3/2010 | Tyree et al. |
| 2010/0182874 A1 | 7/2010 | Frank et al. |
| 2010/0277713 A1 | 11/2010 | Mimeault |
| 2011/0049355 A1 | 3/2011 | Fuhrer et al. |
| 2011/0205521 A1 | 8/2011 | Mimeault et al. |
| 2013/0044310 A1 | 2/2013 | Mimeault |
| 2013/0099959 A1 | 4/2013 | Matsuo |
| 2013/0314711 A1 | 11/2013 | Cantin et al. |
| 2015/0028213 A1* | 1/2015 | Weinberg ............. G01S 7/4861 250/340 |
| 2015/0116695 A1 | 4/2015 | Bartolome et al. |
| 2016/0003946 A1 | 1/2016 | Gilliland et al. |
| 2016/0084946 A1 | 3/2016 | Turbide |
| 2016/0223671 A1 | 8/2016 | Thayer et al. |
| 2017/0052267 A1 | 2/2017 | Matthews |
| 2017/0082746 A1 | 3/2017 | Kubota et al. |
| 2017/0090019 A1 | 3/2017 | Slobodyanyuk et al. |
| 2017/0155225 A1 | 6/2017 | Villeneuve et al. |
| 2017/0184399 A1 | 6/2017 | Thayer et al. |
| 2017/0343670 A1 | 11/2017 | Matthews |
| 2017/0363740 A1 | 12/2017 | Kubota et al. |
| 2018/0081032 A1 | 3/2018 | Torruellas et al. |
| 2018/0081041 A1 | 3/2018 | Niclass et al. |
| 2018/0088216 A1 | 3/2018 | Gill et al. |
| 2018/0143305 A1 | 5/2018 | Buskila et al. |
| 2018/0209764 A1 | 7/2018 | Ginsberg et al. |
| 2018/0239021 A1 | 8/2018 | Akselrod et al. |
| 2018/0027531 A1 | 9/2018 | Horsch et al. |
| 2018/0306926 A1 | 10/2018 | Lachapelle et al. |
| 2018/0356502 A1 | 12/2018 | Hinderling et al. |
| 2019/0018143 A1 | 1/2019 | Thayer et al. |
| 2019/0033431 A1 | 1/2019 | Haneda et al. |
| 2019/0063915 A1 | 2/2019 | Hinderling et al. |
| 2019/0086542 A1 | 3/2019 | Kubota et al. |
| 2019/0129031 A1 | 5/2019 | Qiu et al. |
| 2020/0003877 A1 | 1/2020 | Zhu et al. |
| 2020/0041651 A1 | 2/2020 | Kapusta et al. |
| 2020/0083896 A1* | 3/2020 | Mostafanezhad ... H03M 1/1265 |
| 2020/0256955 A1 | 8/2020 | Kapusta et al. |
| 2020/0256960 A1 | 8/2020 | Lachapelle et al. |
| 2020/0271764 A1 | 8/2020 | Zhu et al. |
| 2020/0341146 A1 | 10/2020 | Dussan et al. |
| 2020/0341147 A1 | 10/2020 | Dussan et al. |

FOREIGN PATENT DOCUMENTS

| | | |
|---|---|---|
| EP | 2605034 | 6/2013 |
| EP | 2605034 B1 | 4/2014 |
| EP | 3447534 | 2/2019 |
| WO | 2017181453 | 10/2017 |

OTHER PUBLICATIONS

"European Application Serial No. 20192615.1, Extended European Search Report dated Jan. 25, 2021", 8 pgs.

"U.S. Appl. No. 16/051,096, Response filed Apr. 27, 2021 to Non Final Office Action dated Jan. 27, 2021", 14 pgs.

Niclass, Cristiano, et al., "A 0.18-m CMOS SoC fora 100-m-Range 10-Frame/s 200 96-Pixel Time-of-Flight Depth Sensor", IEEE Journal of Solid-Sate Circuits, vol. 49, No. 1, (Jan. 2014), 315-329.

"U.S. Appl. No. 16/051,096, Advisory Action dated Nov. 2, 2021", 3 pgs.

"U.S. Appl. No. 16/051,096, Final Office Action dated May 3, 2022", 9 pgs.

"U.S. Appl. No. 16/051,096, Non Final Office Action dated Nov. 29, 2021", 13 pgs.

"U.S. Appl. No. 16/051,096, Response filed Mar. 29, 2022 to Non Final Office Action dated Nov. 29, 2021", 12 pgs.

"U.S. Appl. No. 16/051,096, Response filed Oct. 25, 2021 to Final Office Action dated Jun. 25, 2021", 10 pgs.

"U.S. Appl. No. 16/051,096, Final Office Action dated Jun. 25, 2021", 14 pgs.

"U.S. Appl. No. 16/051,096, Response filed Sep. 6, 2022 to Final Office Action dated May 3, 2022", 11 pgs.

"European Application Serial No. 20192615.1, Communication Pursuant to Article 94(3) EPC dated Sep. 12, 2022", 5 pgs.

"European Application Serial No. 20192615.1, Response filed Jan. 6, 2023 to Communication Pursuant to Article 94(3) EPC dated Sep. 12, 2022", 13 pgs.

* cited by examiner

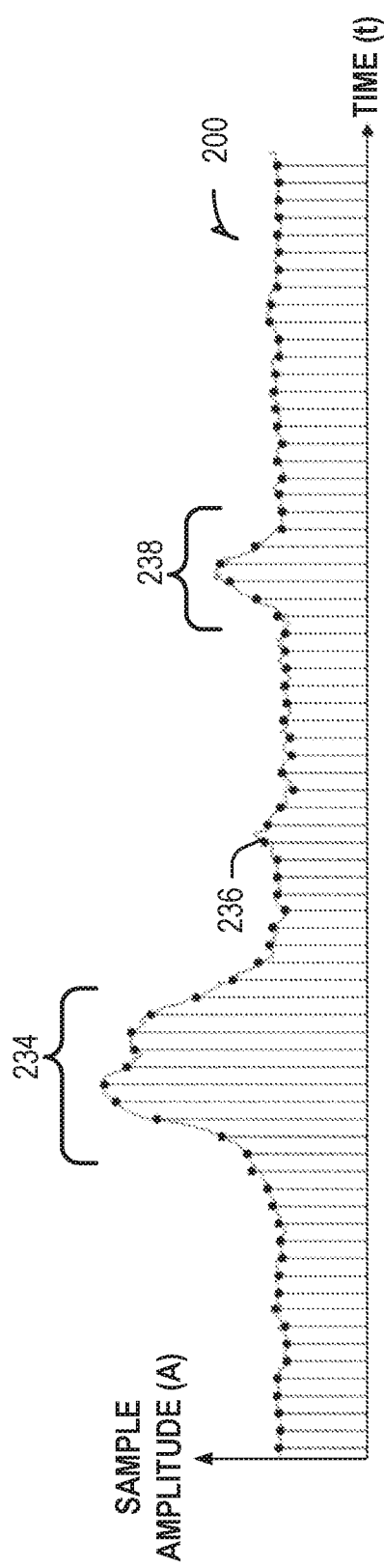
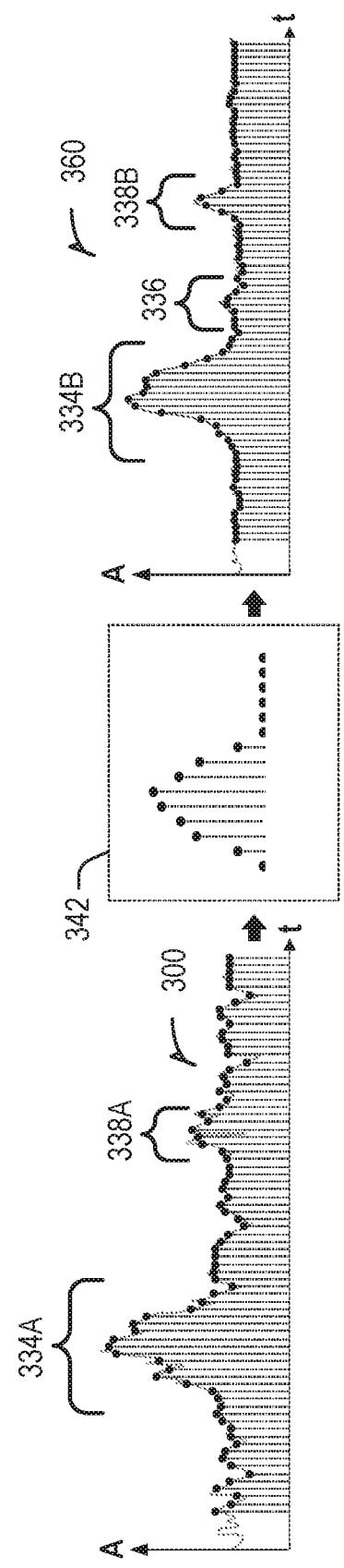
FIG. 2
FIG. 3A

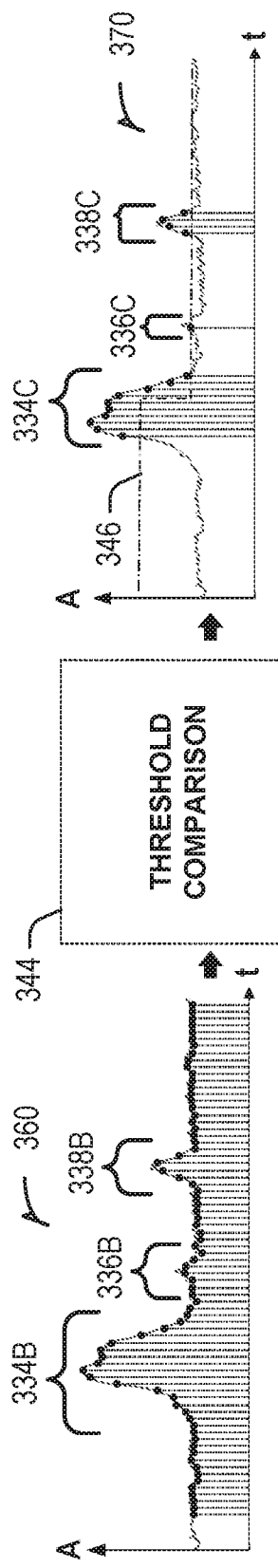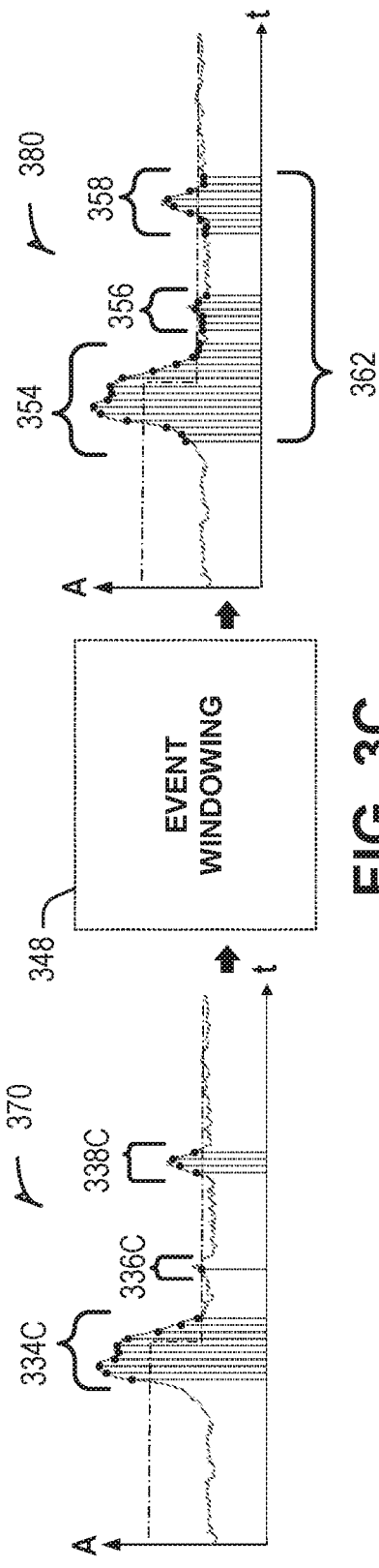
FIG. 3B
FIG. 3C

DATA REDUCTION FOR OPTICAL DETECTION

FIELD OF THE DISCLOSURE

This document pertains generally, but not by way of limitation, to apparatus and techniques that can be used for processing electrical signals indicative of a light received from objects in a field-of-view of an optical receiver, such as for performing one or more of object detection or range estimation to an object, and more particularly, to apparatus and techniques for data reduction in such processing.

BACKGROUND

An optical detection system, such as a system for providing light detection and ranging (LIDAR), generally includes a light source (e.g., an illuminator) and an optical receiver. Various schemes can be used to provide illumination of a field-of-regard (FOR), such as a flash technique in which a large portion or an entirety of the field-of-regard is illuminated contemporaneously. In another approach, scanning can be used to selectively illuminate portions of the field-of-regard. Such scanning can include use of one or more mechanical actuators such as rotating or oscillating mirrors or prism structures to orient a beam of light toward specified portions of the field-of-regard. In yet another approach, a non-mechanical beam-steering technique can be used, either alone or in combination with a mechanically-scanned technique.

Detection of scattered or reflected light can be performed using an array of photodetectors, such as to image a field-of-view (FOV) corresponding to the field-of-regard illuminated by the light source. A time-of-flight determination can be made to estimate a distance to an object or target imaged in the field-of-view, or an object or target can otherwise be localized. Optical detection systems such as LIDAR can be applied in vehicular applications, such as to facilitate operation of autonomous or semi-autonomous vehicles, or to otherwise provide enhanced situational awareness to facilitate safe operation of such vehicles. Other applications can include short range sensing for indoor environments, or beam guidance to facilitate communication or tracking of an object, for example.

SUMMARY OF THE DISCLOSURE

As mentioned above, a pulsed (e.g., "flash") or scanned approach can be used to provide scene illumination, and an optical detection system can determine a range to an object by monitoring a "time-of-flight" of a reflection (e.g., an "echo return"). If analog-to-digital converter (ADC) circuits are used in the receiver, in one approach a "full waveform" processing approach can involve digitizing and digitally-processing an entire return signal at the finest amplitude resolution and finest temporal resolution supported by the ADC. For example, such a full-waveform processing approach can involve determining whether an echo is present (e.g., discrimination), and determining a time at which the echo occurred in the time-domain record. Accordingly, range resolution generally depends on time resolution, and therefore high-sample-rate (e.g., gigasample-per-second) analog-to-digital converter circuits (ADCs) may be used. An amplitude conversion resolution of an ADC may impact a sensitivity of an optical receiver, particularly when operating at or near a range limit or in the presence of interference.

The present inventors have recognized that a challenge can exist when processing is performed for echo discrimination and range estimation on a full-resolution, full-data-rate record from an ADC circuit (e.g., an unabbreviated record having a conversion rate and conversion resolution determined by an input channel of the ADC circuit). For example, amplification and filtering can be performed by analog circuits prior and then such signals can be digitized by an ADC circuit. Such circuitry may be separate from digital processing circuitry used for echo discrimination and range estimation. Accordingly, a data link between and output of one or more ADC circuits and processing circuitry may consume one or more of significant operating power or physical area, and such a scheme may limit an available bandwidth or resolution due to data link capacity limitations. For example, if a low-voltage differential signaling (LVDS) scheme is used for a data link between ADC circuitry and separate processing circuitry, such a serial communication scheme may limit overall data transfer rates to a range of less than one gigabit-per-second. Generally, a data rate required to provide a full-bandwidth, full-resolution record from an ADC circuit is a product of the sample rate times the amplitude resolution (corresponding to a count of bits used to encode the amplitude). As an illustrative example, if a sample rate is 1 gigasample per second, at 16-bit resolution, a single ADC "channel" would require a 16 gigabit-per-second data link to downstream processing circuitry.

The present inventors have also recognized that a significant fraction of the data being transferred between ADC circuitry and downstream processing circuitry is likely unneeded (e.g., background noise or interference), as such a fraction does not correspond to features of interest in the received optical signal and is not relevant for echo discrimination and range estimation. Accordingly, the present inventors have developed, among other things, techniques to identify features of interest from ADC circuitry data prior to inter-circuit communication with downstream object or target processing circuitry. In this manner, a volume of data being transferred to such downstream processing circuitry can be reduced as compared to other approaches, simplifying the receive signal processing chain and providing power savings. First-tier signal processing circuitry to identify features of interest can be located on or within a commonly-shared integrated circuit package with ADC circuitry, and downstream processing circuitry for object processing or range estimation can be fed with a data link meeting less stringent requirements than a link between the ADC circuitry and first-tier signal processing circuitry.

In an example, an optical detection system can include an analog-to-digital conversion (ADC) block comprising at least one input channel, the ADC block configured to receive an electrical signal obtained from a corresponding photo-sensitive detector and configured to provide an output comprising a digital representation of the input determined by a conversion resolution and a conversion rate defined by the at least one input channel, and a signal processor circuit configured to receive the digital output from the ADC block and to identify at least one temporal window within the ADC output corresponding to a feature, the signal processor circuit comprising a digital output to provide an abbreviated representation corresponding to the at least one temporal window including the feature, the digital output transmitting the abbreviated representation. The feature can include a received echo corresponding to a transmitted optical pulse. The abbreviated representation can maintain at least one of the conversion rate or conversion resolution defined by the at least one input channel, within the temporal window. In an example, the signal processor circuit is configured to identify the feature including comparing amplitude values of samples from the digital representation against a threshold, and the signal processor circuit is configured to establish the abbreviated representation corresponding to the at least one temporal window by preserving samples including samples exceeding the threshold and dropping samples elsewhere. For example, the signal processor circuit can be configured to preserve samples including and adjacent to the samples exceeding the threshold, defining the temporal window spanning a duration before and after the samples that exceed the threshold. In an example, the signal processor circuit is configured to vary the threshold as a function of time with respect to a transmitted optical pulse.

In an example, a technique, such as a machine-implemented method can include performing optical detection, such as including receiving an electrical signal from a photosensitive detector, generating a digital output providing a digital representation of the electrical signal determined by a conversion resolution and a conversion rate defined by at least one input channel of an analog-to-digital converter circuit, identifying at least one temporal window within the digital representation corresponding to a feature, and providing an abbreviated representation corresponding to the at least one temporal window including the feature, including transmitting the abbreviated representation digitally. The abbreviated representation can maintain at least one of the conversion rate or conversion resolution defined by the at least one input channel, within the temporal window. Identifying the feature can include comparing amplitude values of samples from the digital representation against a threshold and establishing the digital representation corresponding to the at least one temporal window by preserving samples including to samples exceeding the threshold and dropping samples elsewhere. In an example, preserving samples can include preserving the samples exceeding the threshold defines the temporal window spanning a duration before and after the samples that exceed the threshold. In an example, the threshold can be varied as a function of time, such as with respect to a transmitted optical pulse.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 2 illustrates generally an example comprising a discrete-time representation of received optical signal, such as provided by an analog-to-digital converter circuit.

FIG. 3A illustrates generally an example comprising filtering a received optical signal, such as using a finite-impulse-response (FIR) digital filter, to provide a filtered representation of the received optical signal.

FIG. 3B illustrates generally an example comprising identifying one or more features using a threshold comparison, such as by applying the thresholding to a filtered representation of a received optical signal.

FIG. 3C illustrates generally an example comprising event windowing by preserving samples including and adjacent to samples exceeding a threshold corresponding to a feature, such as to define a temporal window spanning a duration before and after the feature.

DETAILED DESCRIPTION

An optical detection system can include an illuminator, such as a laser or other light source to illuminate objects within a field-of-regard, and an optical receiver to detect light from the illuminator that is reflected or scattered by objects with a corresponding field-of-view. Generally, a single photo-sensitive detector or an array of such photo-sensitive detectors is used to detect received light. In optical detection systems, a "readout integrated circuit" (ROIC) can include input channels that can be coupled to corresponding photo-sensitive detectors, and such input channels can provide amplification and digitization of an electrical signal corresponding to a received optical signal from the photo-sensitive detectors. In generally-available systems, such an ROIC generally does not discriminate between echo information in received data versus non-echo information (e.g., noise or interference), and much of the data provided by the ROIC can be discarded. As mentioned above, the present inventors have recognized that apparatus and techniques as described herein can be used to help identify features of interest in such received data, such as providing data reduction and thereby one or more of reducing data link complexity or supporting an increased channel-count using an existing data link topology, as compared to other approaches. Such techniques can be implemented within an ROIC device (e.g., monolithically), as an example. The apparatus and techniques described herein are applicable to optical detection, such as optical ranging or object localization. For example, the apparatus and techniques described herein can be used in a light detection and ranging (LIDAR) system, as an illustrative example.

Figure 1:
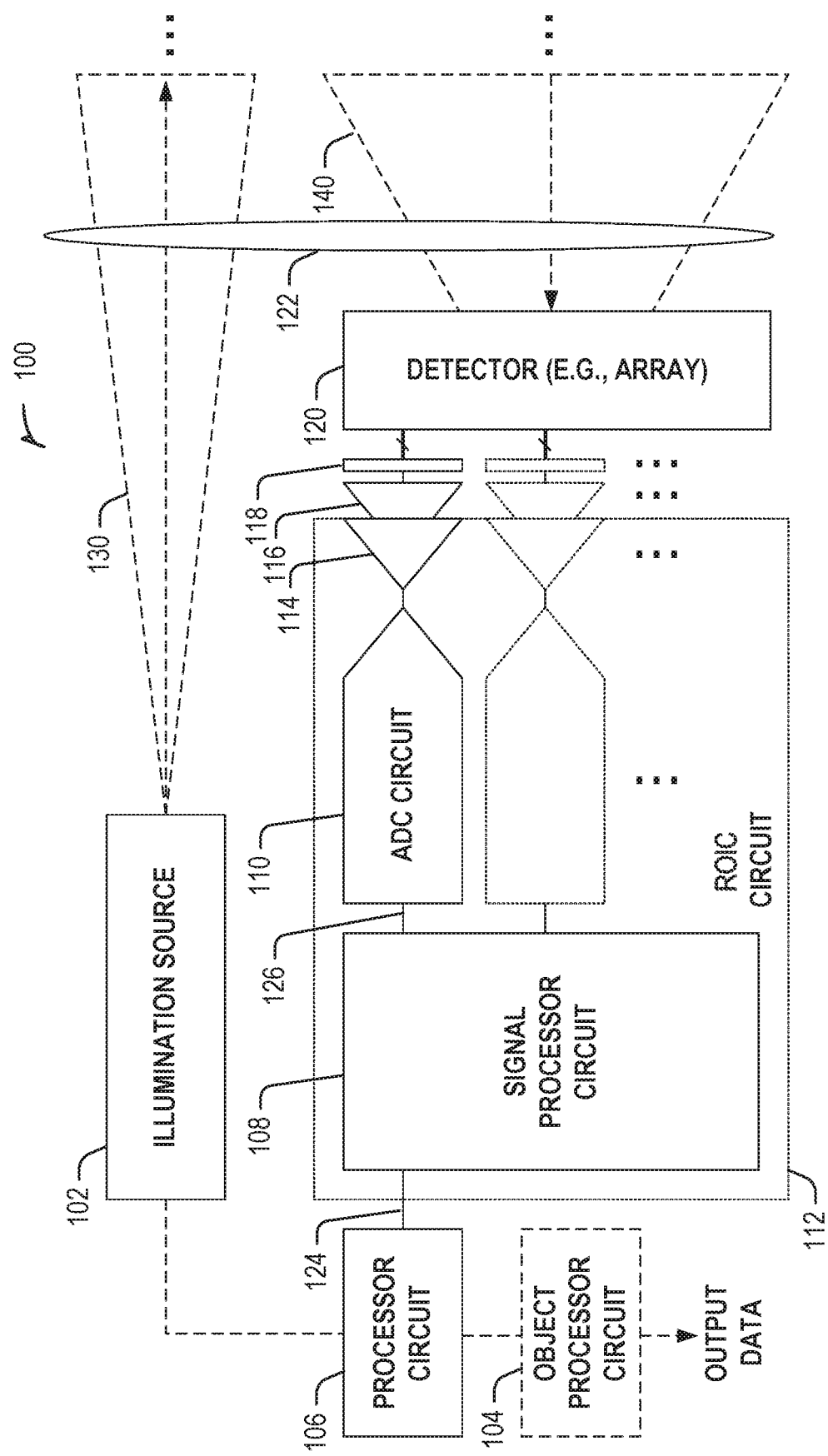
FIG. 1 illustrates generally an example comprising an optical detection system, such as can include an optical receiver signal chain that can provide enhanced data throughput efficiency using a data reduction technique.

FIG. 1 illustrates generally an example comprising an optical detection system 100, such as can include an optical receiver signal chain that can provide enhanced data throughput efficiency using a data reduction technique. In the optical detection system 100, a field-of-regard (FOR)

130 can be illuminated by an illumination source 102. Such an illumination source 102 can include one or more solid-state devices, such as a light-emitting diode, a diode laser, or an array of such devices. Illustrative examples of illumination light sources include lasers having a Master Oscillator Power Amplifier (MOPA) architecture, an Edge-Emitting Laser (EEL), or a Diode-Pumped Solid-State Laser (DPSSL). Other device architectures can be used, such as a vertical-cavity surface-emitting laser (VCSEL). In an illustrative example, the illumination source 102 can generate light in a near infrared (NIR) wavelength band (e.g., from about 750 nanometers to about 1400 nm). Such a range of wavelengths is illustrative, and other wavelength ranges can be used depending on the light source and receiver architecture. According to various examples, a "flash" scheme can be used where a portion or an entirety of the 130 is illuminated without requiring scanning, and reflections are then detected (e.g., imaged) by an optical receiver. In another approach, a scanned transmit scheme can be used where a spot or a line generated by a transmitter is steered to various locations in the field-of-regard 130.

Objects in the field of regard can scatter or reflect the transmitted light, and such scattered or reflected light can be detected by an optical receiver. A time-of-flight can be determined between launch of illumination and an instant corresponding to receipt of scattered or reflected light from the object. Such a time-of-flight can be used to establish a range estimate to the object from the optical detection system 100. Generally, an angular field observed by the optical receiver can be referred to as a field-of-view (FOV) 140. The FOV 140 generally overlaps with the FOR 130 illuminated by the transmitter, but the two need not have the same shape or spatial extent. If the receiver uses a different optical path with respect to the transmitter, the transmit/receive configuration can be referred to as a bistatic configuration. If the receiver uses the same optical path as the transmitter, the transmit/receive configuration can be referred to as a monostatic configuration. If the receiver is arranged to provide an FOV 140 along an axis that is nearby a corresponding axis of the transmitter field-of-regard, the configuration can be referred to as a biaxial monostatic configuration. The techniques described in this document are applicable to a variety of such transmitter and receiver configurations.

Generally, an array of photodetectors may be used such as to rapidly image a portion or an entirety of an FOV 140 without requiring scanning. For example, a detector 120 can receive scattered or reflected light from the FOV 140, such as through an optical structure 122 (e.g., a lens structure or multiple structures such as one or more lenses, filters, or polarizers). The optical structure 122 can be dedicated to the receive optical path or can be shared with a transmitter optical path. A transmissive optical structure 122 is shown, but other structures can be used such as reflective optical structures or planar optical devices. The detector 120 can include an array such as a one-dimensional or two-dimensional array of photodetectors, or even a single photodetector. For example, for detection of wavelengths longer than about 400 nanometers and shorter than 1000 nanometers, a Silicon (Si) photodetector can be used as the optical detector 120. Again, such an example of a specific semiconductor detector and a corresponding wavelength range is an illustrative example.

Generally, a photo-sensitive detector generates an electrical signal such as a current in response to incident light. Processing of such electrical signals can be performed an analog-to-digital conversion block in the receiver architecture using respective "channels," such as defined by one or more amplifiers (e.g., a transimpedance amplifier (TIA) 116 and a buffer, such as a drive amplifier 114) coupled to an analog-to-digital converter (ADC) circuit 110. A multiplexer 118 can be included, such as to route signals from multiple detector elements in the detector 120 to a single receive channel comprising a TIA 116, drive amplifier 114, and ADC 110. Such multiplexing allows a smaller count of ADC 110 channels to be shared amongst multiple photo-sensitive detection elements. The order of the analog elements shown in FIG. 1 is an illustrative example. In FIG. 1, the TIA 116 and drive amplifier 114 are shown as located post-multiplexing (e.g., downstream from the multiplexer 118). In another approach, one or more such amplifiers can be located ahead of the multiplexer 118, such as depending on a count of detector 120 elements or other considerations related to system implementation.

As mentioned elsewhere herein, in one approach, a digital output 126 of the ADC circuit 110 can be routed to a separate field-programmable gate area (FPGA) or general-purpose processor circuit 106, located "off-chip" with respect the ADC circuit 110. The FPGA or general-purpose processor circuit 106 would then receive a full-resolution, full-data-rate digital representation of a received optical signal as digitized (e.g., discretized and encoded) by the ADC circuit 110. However, such an approach can present challenges. As a count of channels increases, and as one or more of a conversion amplitude resolution or conversion (e.g., sampling) rate of the ADC circuit 110 increases, a volume of data provided to the downstream FPGA or processor circuit can increase dramatically. Most of such data generally corresponds to background noise or interference. IF the ADC circuit 110 and other upstream circuitry are located in a separate integrated circuit package from the processor circuit 106 or FPGA, a limited data link capacity between the ADC circuit 110 and processor circuit 106 may thereby limit a usable resolution or sampling rate.

For example, assuming a finite data link capacity, a tradeoff can exist between amplitude resolution (corresponding to sensitivity of the optical receiver), sampling rate (corresponding to a range resolution of the optical receiver and detector or channel count (corresponding to a spatial resolution of the optical receiver). Use of a relatively higher-capacity data link also consumes greater power than lower-bandwidth interface circuitry. In one approach, a down-sampling technique can be used to discard samples or a conversion resolution can be reduced, but such approaches can sacrifice one or more of range accuracy or sensitivity.

To address such challenges, the present inventors have recognized that a signal processor circuit 108 can be co-integrated with at least the ADC circuit 110. In this manner, a full-resolution, full-bandwidth signal from the ADC circuit 110 can be coupled internally to the signal processor circuit 108 by a digital link 126, and the signal processor circuit can perform various techniques (such as shown illustratively in one or more of FIG. 3A, FIG. 3B, FIG. 3C, FIG. 4, or FIG. 5, for example) to provide an abbreviated representation via a data link 124 (e.g., a serial communication interface such as LVDS bus or other interface). The apparatus and techniques described herein need not use a fixed function such as decimation to reduce a volume of sample data to be transferred, but instead identify and separate signals of interest particular to an optical detection system (such as a LIDAR system). As an illustrative example, a buffer such as drive amplifier 114, ADC circuit 110, digital output 126, and signal processor circuit 108 can be co-integrated in a commonly-shared "read-out integrated circuit" (ROTC) monolithic integrated circuit 112. Such an ROIC integrated circuit 112 can include multiple channels having corresponding ADC and drive amplifier circuits, coupled to the signal processor circuit 108. The signal processor circuit 108 can include one or more digital filter circuits, threshold or comparison circuits, windowing circuits, or other circuitry, such as to identify one or more features of interest in a digital data stream provided by respective ADC outputs (e.g., an ADC circuit 110 output 126). Data not related to the feature of interest can be suppressed (e.g., dropped). As an illustrative example, the signal processor circuit 108 can include a digital signal processor (DSP) topology or Application Specific integrated Circuit (ASIC).

After processing by the signal processor circuit 108, an abbreviated representation of time-domain data corresponding to received optical signals can be provided via data link 124 to other processing circuit such as the general-purpose processor circuit 106 or object processing circuitry (e.g., provided by an object processor circuit 104). For example, such an object processor circuit 104 can provide an estimate of one or more of a range to an object corresponding to an identified feature, or a location of such an object as output data. Use of the system 100 topology shown in FIG. 1 can provide one or more of lower power consumption as compared to other topologies having a similar count of detector elements in the detector 120. In another example, such an approach can provide one or more of enhanced spatial resolution, enhanced temporal resolution, or greater sensitivity by supporting higher-performance ADC circuitry or higher detector element counts, for example.

FIG. 2 illustrates generally an example comprising a discrete-time representation 200 of received optical signal, such as provided by an analog-to-digital converter circuit. In FIG. 2, a conversion rate is defined as a reciprocal of a time interval between adjacent samples. A conversion resolution is defined by a count of available amplitude quantizing levels, and frequently such a resolution is specified in terms of a count of bits available to encode amplitude samples. In FIG. 2, a time-domain representation is shown including various amplitude excursions. It is not clear from the time-domain data of FIG. 2 whether one echo, two echoes, or multiple echoes are being received. For example, the portion of the waveform at 234 could include a single echo return or two echo signals closely-spaced in time. The portion at 236 could be an echo or might be a transient due to interference or other noise, and the portion at 238 could be yet another echo signal. In one approach, the entire representation 200 can be provided to a separate processing circuit, such as located off-chip relative to the analog-to-digital converter circuitry.

As mentioned above, an abbreviated representation of the time-domain data can be established. Such data reduction can include various operations. For example, FIG. 3A illustrates generally an example comprising filtering a received optical signal 300, such as using a finite-impulse-response (FIR) digital filter 342, to provide a filtered representation 360 of the received optical signal. Such filtering can assist in removing noise (such as can interfere with threshold determinations or other processing). For example, in the received signal 300, a first feature 334A is visible, and a second feature 338A is visible. The digital filter 342 can be defined at least in part, by a finite-impulse-response topology having filter coefficients corresponding to a desired impulse response function. For example, the impulse response function can be selected to match a transmitted pulse shape provided by an illumination source. In addition, or instead, the filter coefficients can be established to match (e.g., correlate with) a code sequence, and the illumination source can be controlled to emit a time-domain series of pulses or pulse amplitudes corresponding to the code sequence. In this manner, signal contributions from sources other than the transmitter can be rejected to provide the filtered representation 360. In FIG. 3A, the filtered feature 334B appears more distinct, and a third feature 336 appears visible between the filtered feature 334B and a filtered feature 338B.

FIG. 3B illustrates generally an example comprising identifying one or more features using a threshold comparison 344, such as by applying the thresholding operation to a filtered representation 360 of a received optical signal 300. The threshold comparison can include a simple value comparison in which amplitude values of samples are compared against a static threshold value 346, and samples that exceed the threshold value 346 are preserved, while other samples are dropped. In another approach, multiple thresholds can be used, such as a threshold value 346 that decreases in magnitude with respect to time. For example, if a time index is measured from a "pulse launch" or other illumination event (e.g., illumination of a particular region being observed by the receiver), samples in the received optical signal that occur later in time relative to the flash or other illumination event can be compared to a threshold that is lower in magnitude than an initial threshold magnitude. In this manner, the threshold comparison takes into consideration a diminishing received signal amplitude corresponding to an increasing range between the reflecting object and the optical receiver. In another example, the thresholding operation can include hysteresis, such as preserving a first sample exceeding a first threshold, and then preserving subsequent samples until a sample value falls below a second threshold that is lesser in magnitude than the first threshold. In the example of FIG. 3B, features 334B, 336B, and 338B are apparent in a filtered representation 360. The representation 360 can be processed using a threshold comparison 344, and a resulting abbreviated data set 370 can be provided, such as including features 334C, 336C, and 338C at full amplitude resolution, and having inter-sample intervals within each feature provided at full temporal resolution, but with samples located elsewhere dropped to condense the data set.

In yet another example of processing the received optical signal to provide abbreviated data, FIG. 3C illustrates generally an example comprising event windowing at 348 by preserving samples including and adjacent to samples exceeding a threshold corresponding to a feature, such as to define a temporal window spanning a duration before and after the feature. In the example of FIG. 3C, the data set 370 can include samples corresponding to features 334C, 336C and 338C that exceed a specified threshold. In addition, once sample indices are identified corresponding to such features 334C, 336C, and 338C, samples occurring before the initial threshold-crossing sample in each feature can be preserved. In this manner, a specified count of samples or duration before and after a threshold-crossing sample can be preserved in a data set to provide an event-windowed data set 380. As another example, two threshold comparison values can be established, wherein a first threshold is used to define a duration of a temporal window of interest, and second threshold is used to define which samples within the window of interest to preserve. For example, within a temporal window of interest established by the first threshold, samples exceeding the second threshold can be retained, and other samples within the window can be dropped. The data set 380 may include a greater count of samples in the set 360 than would be yielded by thresholding alone, but such a data set 380 is still significantly condensed as compared to a full representation 300 as shown in FIG. 3A, for example. Respective samples in the abbreviated data set 380 can be tagged with either an absolute or relative time index, such as to preserve an ability to perform a range estimate to an object corresponding to one or more of the features 354, 356, or 358.

Figure 4:
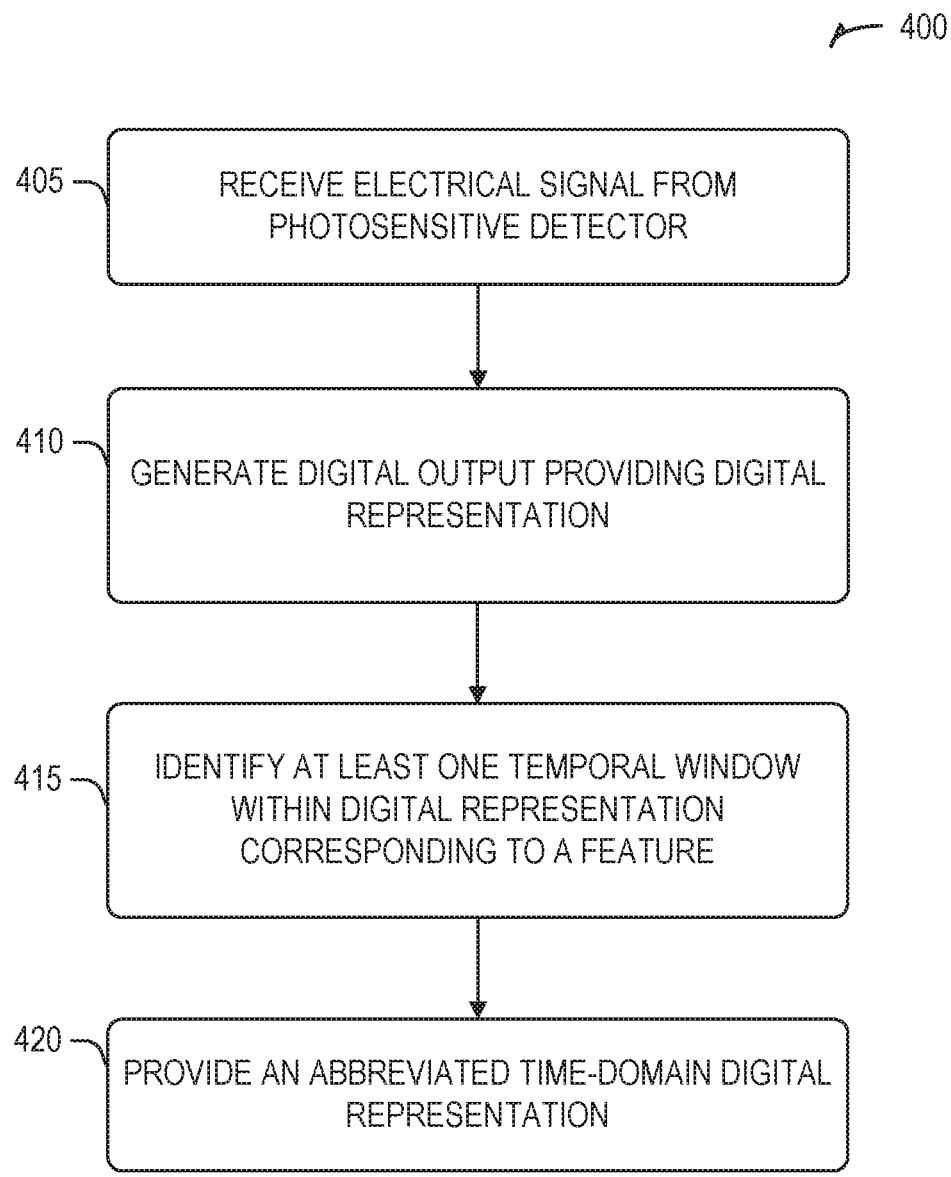
FIG. 4 illustrates generally a technique, such as a method, comprising receiving an electrical signal from a photosensitive detector, generating a digital output providing a digital representation (e.g., a time-domain representation determined by a conversion resolution and a conversion rate defined by at least one input channel of an analog-to-digital converter), and identifying at least one temporal window with in the digital representation, the window corresponding to a feature.

FIG. 4 illustrates generally a technique, such as a method, comprising receiving an electrical signal from a photosensitive detector at 405, generating a digital output providing digital representation at 410, and at 415, identifying at least one temporal window with in the digital representation, the window corresponding to a feature. At 410, the generation of the digital output can include use of an analog-to-digital converter (ADC) circuit, and an amplitude resolution and time resolution of the digital representation provided at the digital output can be determined by a conversion resolution and a conversion rate defined by at least one input channel of the ADC circuit. At 415, the identification of the temporal window can include use of a signal processor circuit that is located within the same integrated circuit device package as the ADC circuit used at 410. At 420, an abbreviated (e.g., time-domain digital) representation of the received optical signal can be provided, such as by dropping samples outside one or more temporal windows identified at 415. Providing the abbreviated representation can include digitally transmitting the abbreviated representation, such as from a first integrated circuit die housing a signal processing circuit to a second integrated circuit die.

Figure 5:
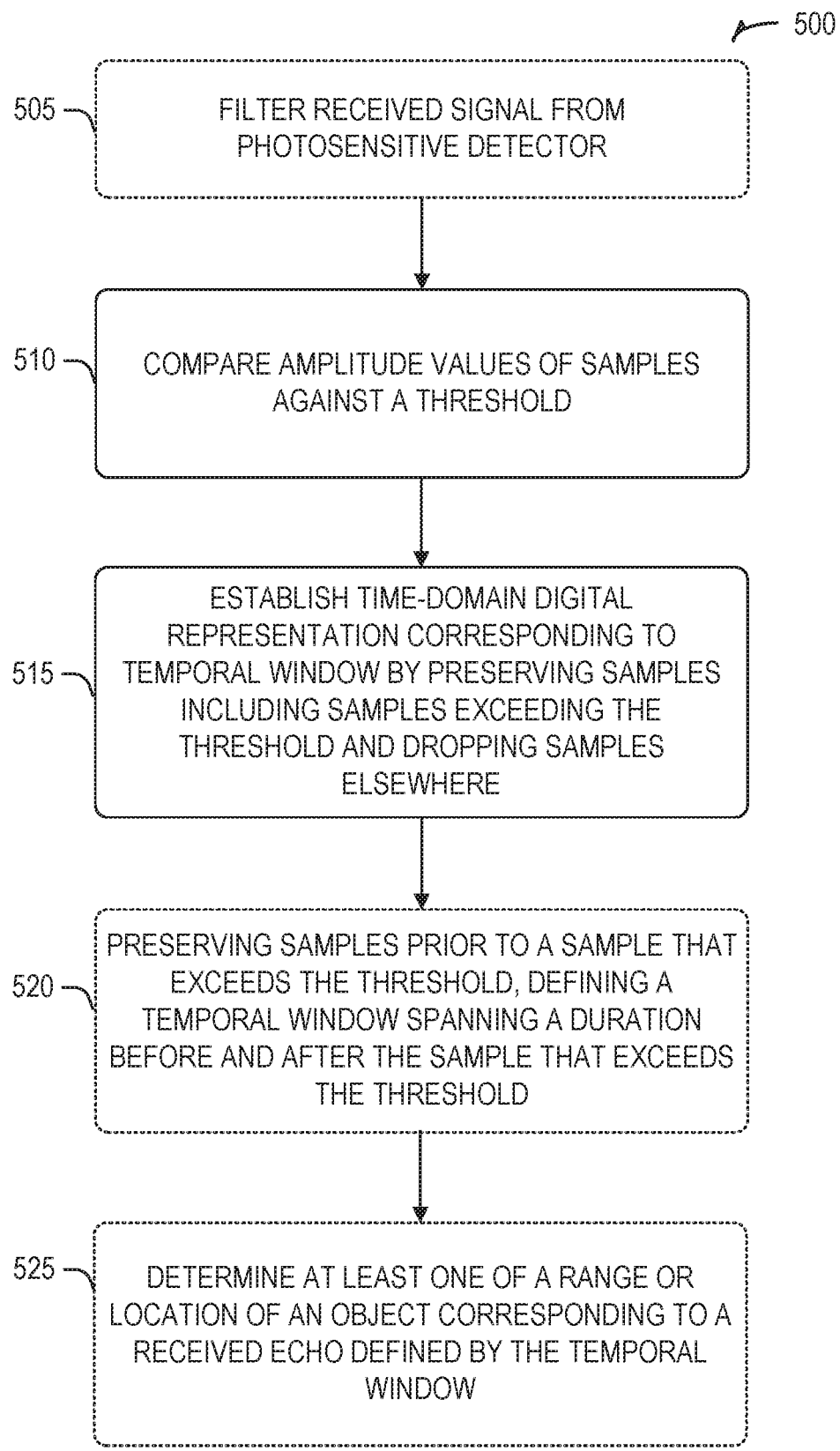
FIG. 5 illustrates generally a technique, such as a method, comprising comparing values of samples of a received optical signal against a threshold, establishing a time-domain digital representation of the optical signal corresponding to a temporal window, optionally including preserving samples prior to a sample that exceeds a threshold, and optionally including determining at least one of range to an object or a location of an object corresponding to a received echo defined by the temporal window.

FIG. 5 illustrates generally a technique, such as a method, comprising comparing values of samples of a received optical signal against a threshold at 510, establishing a time-domain digital representation of the optical signal corresponding to a temporal window at 515, and optionally including preserving samples prior to a sample that exceeds a threshold at 520, and optionally including determining at least one of range to an object or a location of an object corresponding to a received echo defined by the temporal window at 525. In an example, the establishment of a temporal window at 515 or 520 can be performed using a signal processor circuit that is separate from an object detection or general-purpose processor circuit used for range determination or object localization at 525. Providing the abbreviated representation can include digitally transmitting the abbreviated representation, such as from a first integrated circuit die housing a signal processing circuit to a second integrated circuit die including an object detection circuit or generally-purpose processor circuit.

Each of the non-limiting aspects in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An optical detection system, comprising:
an analog-to-digital conversion (ADC) block comprising at least one input channel, the ADC block configured to receive an electrical signal obtained from a corresponding photosensitive detector and configured to provide an output comprising a digital representation of the input determined by a conversion resolution and a conversion rate defined by the at least one input channel; and a signal processor circuit configured to receive the digital output from the ADC block and to identify at least one temporal window within the ADC output corresponding to a feature, the signal processor circuit comprising a digital output to provide an abbreviated representation of the digital output from the ADC block corresponding to the at least one temporal window including the feature, the digital output transmitting the abbreviated representation.

2. The detection system of claim 1, wherein the feature comprises a received echo corresponding to a transmitted optical pulse.

3. The detection system of claim 1, wherein the abbreviated representation maintains at least one of the conversion rate or conversion resolution defined by the at least one input channel, within the temporal window.

4. The optical detection system of claim 1, wherein the signal processor circuit is configured to identify the feature including comparing amplitude values of samples from the digital representation against a threshold; and
wherein the signal processor circuit is configured to establish the abbreviated representation corresponding to the at least one temporal window by preserving samples including samples exceeding the threshold and dropping samples elsewhere.

5. The optical detection system of claim 4, wherein the signal processor circuit is configured to preserve samples including and adjacent to the samples exceeding the threshold, defining the temporal window spanning a duration before and after the samples that exceed the threshold.

6. The optical detection system of claim 4, wherein the signal processor circuit is configured to vary the threshold as a function of time with respect to a transmitted optical pulse.

7. The optical detection system of claim 1, wherein the signal processor circuit is configured to digitally filter the digital representation prior to identification of the temporal window.

8. The optical detection system of claim 7, wherein the digital filter comprises a finite impulse response (FIR) filter with respective weights corresponding to at least one of a transmit pulse shape or a coded transmit pulse sequence.

9. The optical detection system of claim 1, comprising an amplifier coupled to the at least one input channel.

10. The optical detection system of claim 9, wherein the ADC block, the signal processor circuit, and the amplifier are co-integrated as a portion of an integrated circuit package.

11. The optical detection system of claim 1, further comprising a processor circuit coupled to the signal processor circuit, the processor circuit configured to estimate a range to a target corresponding to the feature using the abbreviated representation.

12. A method for performing optical detection, comprising:

receiving an electrical signal from a photosensitive detector;
generating a digital output providing a digital representation of the electrical signal determined by a conversion resolution and a conversion rate defined by at least one input channel of an analog-to-digital converter circuit;
identifying at least one temporal window within the digital representation corresponding to a feature; and
providing an abbreviated representation of the digital representation corresponding to the at least one temporal window including the feature, including transmitting the abbreviated representation digitally.

13. The method of claim 12, wherein the abbreviated representation maintains at least one of the conversion rate or conversion resolution defined by the at least one input channel, within the temporal window.

14. The method of claim 12, wherein identifying the feature includes comparing amplitude values of samples from the digital representation against a threshold; and
establishing the digital representation corresponding to the at least one temporal window by preserving samples including to samples exceeding the threshold and dropping samples elsewhere.

15. The method of claim 14, wherein preserving samples including the samples exceeding the threshold defines the temporal window spanning a duration before and after the samples that exceed the threshold.

16. The method of claim 14, comprising varying the threshold as a function of time with respect to a transmitted optical pulse.

17. The method of claim 12, comprising digitally filtering the digital representation using a finite impulse response (FIR) filter;
wherein respective weights of the FIR filter correspond to at least one of an optical transmit pulse shape or a coded transmit pulse sequence.

18. An optical detection system, comprising:
a means for generating a digital representation of an electrical signal from a photosensitive detector; and
a means for identifying at least one temporal window within the digital representation corresponding to a feature; and
a means for providing an abbreviated digital representation corresponding to the at least one temporal window including the feature, including transmitting the abbreviated representation digitally.

19. The optical detection system of claim 18, comprising:
a means for comparing amplitude values of samples from the digital representation against a threshold; and
a means for preserving samples including and adjacent to samples exceeding the threshold and dropping samples elsewhere to provide the abbreviated representation.

20. The optical detection system of claim 19, comprising a means for preserving samples prior to a sample that exceeds the threshold, defining a temporal window spanning a duration before and after the samples that exceed the threshold.

* * * * *